United States Patent
Usui

(10) Patent No.: US 6,469,583 B1
(45) Date of Patent: Oct. 22, 2002

(54) PLL CONTROL CIRCUIT FOR DIGITAL OSCILLATION FREQUENCY CONTROL AND CONTROL METHOD ADOPTED IN THE SAME

(75) Inventor: Hisayoshi Usui, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/644,680

(22) Filed: Aug. 24, 2000

(30) Foreign Application Priority Data

Aug. 25, 1999 (JP) .......................................... 11-238254

(51) Int. Cl.[7] ............................................... H03L 7/00
(52) U.S. Cl. ........................ 331/1 A; 331/25; 331/16; 327/156; 327/159
(58) Field of Search ........................... 331/25, 1 A, 16; 327/156, 159

(56) References Cited

U.S. PATENT DOCUMENTS 5,008,629 A * 4/1991 Ohba et al. ............... 331/14 X
5,357,215 A 10/1994 Greiderer

FOREIGN PATENT DOCUMENTS

| GB | 2 236 922 A | 4/1991 |
|---|---|---|
| GB | 2 278 969 A | 12/1994 |
| GB | 2 340 680 A | 2/2000 |
| JP | 53-04469 | 11/1993 |
| JP | 8-279749 | 10/1996 |
| JP | 10-65535 | 3/1998 |

* cited by examiner

Primary Examiner—Arnold Kinkead
(74) Attorney, Agent, or Firm—Foley & Lardner

(57) ABSTRACT

In the PLL, the outputs of a reference frequency oscillator (101) and a VCO (102) are frequency divided by variable frequency dividers (104, 105), respectively, and the outputs thereof are compared in a phase comparator (106). The frequency division numbers of the variable frequency dividers (104, 105) are switched at the same time according to the outputs of registers (108, 109) and the output of an S/P converter (110). Serial data stored in registers (114–116) is fed out at a timing preset in a timer circuit (112) via a P/S converter (111) to the S/P converter (110). Thus, the PLL control circuit and a PLL control method reduces the frequency pull-in time due to frequency skip occurring when switching the PLL output frequency.

14 Claims, 10 Drawing Sheets

FIG.2

| D17 | D16 | D15 | D14 | D13 | D12 | D11 | D10 | D09 | D08 | D07 | D06 | D05 | D04 | D03 | D02 | D01 | D00 |

| | 0 | 0 |
|---|---|---|

R0-0~R0-15:SET FREQUENCY DIVISION NUMBER BY BINARY NUMBER OF REGISTER 108

| | 1 | 0 |
|---|---|---|

R1-0~R1-15:SET FREQUENCY DIVISION NUMBER BY BINARY NUMBER OF REGISTER 109

| | R | 1 |
|---|---|---|

N-0~N-15:SET FREQUENCY DIVISION NUMBER BY BINARY NUMBER OF VARIABLE FREQUENCY DIVIDER 105

R: "0"=WRITE VALUE OF REGISTER 108 IN VARIABLE FREQUENCY DIVIDER 104
"1"=WRITE VALUE OF REGISTER 109 IN VARIABLE FREQUENCY DIVIDER 104

FIG.6
(PRIOR ART)

| D16 | D15 | D14 | D13 | D12 | D11 | D10 | D09 | D08 | D07 | D06 | D05 | D04 | D03 | D02 | D01 | D00 |
|---|---|---|---|---|---|---|---|---|---|---|---|---|---|---|---|---|

| R0-0~R0-15 : SET FREQUENCY DIVISION NUMBER BY BINARY NUMBER OF VARIABLE FREQUENCY DIVIDER 104 | 0 |
|---|---|

| N-0~N-15 : SET FREQUENCY DIVISION NUMBER BY BINARY NUMBER OF VARIABLE FREQUENCY DIVIDER 105 | 1 |
|---|---|

US 6,469,583 B1

PLL CONTROL CIRCUIT FOR DIGITAL OSCILLATION FREQUENCY CONTROL AND CONTROL METHOD ADOPTED IN THE SAME

BACKGROUND OF THE INVENTION

The present invention relates to a PLL (Phase Locked Loop) control circuit for digital oscillation frequency control and a control method adopted in the same.

In such communication units as heterodyne receivers, particularly portable telephone sets, a local oscillator executes a mixing operation to obtain an intermediate frequency signal having a fixed frequency difference from a desired received signal frequency. Also, the intermediate frequency signal thus obtained is amplified in a high grain intermediate frequency amplifier to realize high reception sensitivity. To this end, a PLL is often used as local oscillator.

FIG. 5 is a block diagram showing a prior art example of PLL control circuit, and FIG. 10 shows the frame timing of al usual digital portable telephone set. As shown in FIG. 10, in the digital portable telephone set a reception channel, peripheral channels and a transmission channel are switched one over to another in a fixed cycle. In this case, the PLL output frequency should also be switched.

In this case, the PLL output frequency should be pulled in a short period of time at the time of the frequency switching. The prior art PLL control circuit will now be described with reference to FIG. 5 by assuming PLL output frequency to be, for instance:

680 MHz at the reception channel time,
690 MHz at the peripheral channel time and
740 MHz at the transmission channel time.

The PLL circuit shown in FIG. 5 is a typical one comprising a reference frequency oscillator 101, a voltage controlled oscillator (VCO) 102, variable frequency dividers 104 and 105 for frequency dividing the outputs of the two oscillators 101 and 102, respectively, a phase comparator 108 for phase comparing the outputs of the two variable frequency dividers 104 and 105, a charge pump 107 connected to the output side of the phase comparator 106, and a low-pass filter 103 for filtering the output of the charge pump 107 and feeding back the filtered output to the VCO 102. The above component constitutes a typical PLL. The PLL control circuit further comprises a serial-to-parallel (S/P) converter 110 for controlling the variable frequency dividers 104 and 105, a parallel-to-serial (P/S) converter 111 for controlling the S/P converter 110, a timer circuit 112 and a central processing unit (CPU) 113. The individual circuit components noted above are well known to one skilled in the art, and they will not be described here.

The reference frequency of the reference frequency oscillator 101 is assumed to be 14.4 MHz. Then, when the output frequency of the VCO 102 is set to 680 MHZ at the reception channel time:

the phase comparison frequency of the phase comparator 106 is 200 kHz;
the frequency division number of the variable frequency divider 104 is 14.4 MHz/200 kHz=72; and
the frequency division number of the variable frequency divider 105 is 680 MHz/200 kHz=3,400.

When the output frequency of the VCO 102 is set to 690 MHz at the peripheral channel time:

the phase comparison frequency of the phase comparator 106 is 200 kHz;
the frequency division number of the variable frequency divider 104 is 14.4 MHz/200 kHz=72; and
the frequency division number of the variable frequency divider 105 is 690 MHZ/200 kHz=3.450.

When the output frequency of the VCO 102 is set to 740 MHz at the transmission channel time:

the phase comparison frequency of the phase comparator 106 is 160 MHz;
the frequency division number of the variable frequency divider 164 is 14.4 HMz/160 kHz=90; and
the frequency division raito of the variable frequency divider 104 is 740 MHz/160 kHz=4,625.

The operation in the case of sequentially designating the above settings in a time schedule as shown in FIG. 10, will now be described with reference to the flow chart of FIG. 7, i.e., the flow chart of control routine in the CPU 113 shown in FIG. 5. FIG. 6 shows the format of serial data. The serial data consist of data "D00" to "D16", and designate the frequency division. number of the variable frequency dividers 104 and 105 in the form of binary numbers.

Referring to the flow chart of FIG. 7, in a step S1 the CPU 113 waits for an interruption from the timer circuit 112. When receiving an interruption from the timer circuit 112, the CPU determines the kind of the interruption. Specifically, in a step S2 the CPU checks whether the kind of the interruption is "A". When the kind is "A", the CPU executes steps S3 to S5. More specifically, when the kind is "A", corresponding to the frequency setting at the reception channel time, the CPU sets the frequency division number of the variable frequency divider 104 by using the format of "D00"="0" in FIG. 6 (step S3). Then, the CPU waits for completion of the serial output from the P/S converter 111 (step S4). Then, the CPU sets the frequency division number of the variable frequency divider 105 by using the format of "D00"="1" in FIG. 6 (step S5).

When it is not determined in the step S2 that the kind of interruption is "A", the CPU executes a step S6 of checking whether the kind of interruption is "B". When it is determined in the step S6 that the kind of interruption is "B", the CPU executes steps S7 to S9 for frequency setting at the peripheral channel time shown in FIG. 10. More specifically, in the step S7 the CPU sets the frequency division number of the variable frequency divider 104 by using the format of "D00"="0". Then, in the step S8 the CPU waits for completion of the serial output of the P/S converter 111. Then, in the step S9 the CPU sets the frequency division number for the variable frequency divider 105 by using the format of "D00"="1".

Finally, when it is not determined in the step S6 that the kind of interruption is "B", the CPU executes step S10 to check whether the kind of interruption is "C". When the kind is "C", the CPU executes steps S11 to S13 for frequency setting at the transmission channel time shown in FIG. 10. More specifically, in the step S11 the CPU sets the frequency division number of the variable frequency divider 104 by using the format of "D00"="0". Then, in the step S12 the CPU waits for completion of the serial output of the P/S converter 111. Subsequently, in the step S13 the CPU sets the frequency division number for the variable frequency divider 105 by using the format of "D00"="1" in FIG. 6.

Problems arising in the above prior art technique will now be described in connection with a case of frequency switching from the transmission channel to the reception channel.

At the transmission channel time, the frequency division number of the variable frequency divider 104 is set to 90, so that the output frequency thereof is 14.4 MHz/90=160 kHz. The frequency division number of the variable frequency divider 105 is set to 4,625, and the PLL is controlled to make the output frequency of the variable frequency divider 104 equal to the output frequency (160 kHz) of the variable frequency divider 104. The frequency of the VCO 102 is 160 kHZ×4,625=740 MHz.

For frequency switching to the reception channel frequency, the frequency division number of the variable frequency divider 104 is set to 72 so that the output frequency thereto is 14.4 MHz/72=200 kHz. At this time, the frequency division number of the variable frequency divider 105 remains at 4,625, and the PLL circuit is controlled such that its output frequency approaches 200 kHz×4,625=925 MHz. Subsequently, the frequency division number of the variable frequency divider 105 is set to 3,400. At this time and only at this time the PLL circuit is controlled to make the output frequency of the VCO 102 to be 200 kHz×3,400= 68 MHz.

In the above process of switching the output frequency of the PLL: circuit, by switching the frequency from 740 MHz to 680 MHz, the frequency is switched from 740 MHz to 925 MHz and then to 680 MHz. It is thus a problem that a certain time is taken from the start of the frequency switching operation until the desired frequency is obtained.

Besides, as is: obvious from the flow chart of FIG. 7, the CPU 113 requires a complicated control, and its burden necessary for the output frequency switching of the PLL circuit is considerable.

FIG. 8 is a block diagram showing a different prior art example. FIG. 9 is a flow chart illustrating the operation of this example. FIG. 8 is similar to FIG. 5. Thus, like components are designated by like reference numerals, and only the difference of this example from the preceding example will be mainly described. The PLL control circuit shown in FIG. 8 uses a VCO 202 of frequency band switching type, which is capable of being frequency band switched by the CPU 113. Such VCO 202 is often employed in case where the oscillation frequency band is broad. In this case, after the output frequency setting of the variable frequency divider 105 a signal for switching the frequency band of the VCO 202 is provided from a port of the CPU 113.

The operation of the PLL circuit shown in FIG. 8 is as shown in the flow chart of FIG. 9. In the Figure, steps S20 to S24, S26 to S29 and S312 to S34 correspond to the steps S1 to S5, S6 to S9 and S10 to S13 in FIG. 7, respectively. This example is thus different in that when the kind of interruption is determined to be "A", "B" and "C", the steps S25, S30 and S35 of setting the control output of the VCO 202 are executed, respectively. To this end, the PLL circuit executes a pull-in operation after the frequency band switching of the VCO 202, thus giving rise to the problem that further time is taken until the frequency. is stabilized.

SUMMARY OF THE INVENTION

An object of the present invention is to provide a PLL control circuit, the output frequency of which is pulled in to a desired frequency in a relatively short period of time at the time of the frequency switching, and a method of controlling the same.

According to a first aspect of the present invention, there is provided a PLL control circuit comprising a reference frequency oscillator for executing oscillation at a reference oscillation frequency, a voltage controlled oscillator (VCO) for feeding out an output at a frequency corresponding to a control voltage, first and second variable frequency dividers for frequency dividing the outputs of the reference frequency oscillator and the VCO, respectively, a phase comparator for phase comparing the outputs of the two variable frequency dividers, a low-pass filter for filtering out the output of the phase comparator and feeding the control voltage to the VCO, wherein: the PLL control circuit further comprises at least one register for storing the frequency division numbers of the variable frequency dividers.

According to a second aspect of the present invention, there is provided a PLL control circuit comprising a reference frequency oscillator for executing oscillation at a reference oscillation frequency, a voltage controlled oscillator (VCO) for feeding out an output at a frequency corresponding to a control voltage, first and second variable frequency dividers for frequency dividing the outputs of the reference frequency oscillator and the VCO, respectively, a phase comparator for phase comparing the outputs of the two variable frequency dividers, a low-pass filter for filtering out the output of the phase comparator and feeding the control voltage to the VCO, wherein: the frequency division numbers of the variable frequency dividers are simultaneously set by the register.

According to a third aspect of the present invention, there is provided a PLL control circuit comprising a reference frequency oscillator for executing oscillation at a reference oscillation frequency, a voltage controlled oscillator (VCO) for feeding out an output at a frequency corresponding to a control voltage, first and second variable frequency dividers for frequency dividing the outputs of the reference frequency oscillator and the VCO, respectively, a phase comparator for phase comparing the outputs of the two variable frequency dividers, a low-pass filter for filtering out the output of the phase comparator and feeding the control voltage to the VCO, wherein: the PLL control circuit further comprises at least one register for storing the frequency division numbers of the variable frequency dividers and a timer circuit for determining the timing of switching of the frequency division numbers of the variable frequency dividers.

According to a fourth aspect of the present invention, there is provided a PLL control circuit comprising a reference frequency oscillator for executing oscillation at a reference oscillation frequency, a voltage controlled oscillator (VCO) for feeding out an output at a frequency corresponding to a control voltage, first and second variable frequency dividers for frequency dividing the outputs of the reference frequency oscillator and the VCO, respectively, a phase comparator for phase comparing the outputs of the two variable frequency dividers, a low-pass filter for filtering out the output of the phase comparator and feeding the control voltage to the VCO, wherein: the frequency division numbers of the variable frequency dividers are simultaneously set by the register and the PLL control circuit further comprises a timer circuit for determining the timing of switching of the frequency division numbers of the variable frequency dividers.

Two registers corresponding to the first and second variable frequency dividers are provided. A plurality of registers are provided for storing serial data for switching the frequency division numbers of the variable frequency dividers to different values. The timer circuit operates according to the output of the reference frequency oscillator of the PLL. The PLL control circuit further comprises a CPU controlled by the timer circuit, the timer circuit being capable of producing an interruption to the CPU after the reading of the contents stored in the registers for storing the serial data.

According to other aspect of the present invention, there is provided, in a PLL in which the outputs of variable frequency dividers for frequency dividing the outputs of a reference frequency divider and a VCO, respectively, are compared in a phase comparator, a PLL control method for switching the frequency division numbers of the variable frequency dividers to different values, wherein: the frequency division numbers of the variable frequency dividers are switched at the same time to sequentially different values by registers storing the frequency division numbers.

Other objects and features will be clarified from the following description with reference to attached drawings.

BRIEF DESCRIPTION OF THE DRAWINGS

FIG. 2 shows the data format of the serial data in FIG. 1;

FIG. 6 shows the format of serial data in FIG. 5;

PREFERRED EMBODIMENTS OF THE INVENTION

Preferred embodiments of the present invention will now be described with reference to the drawings.

Figure 1:
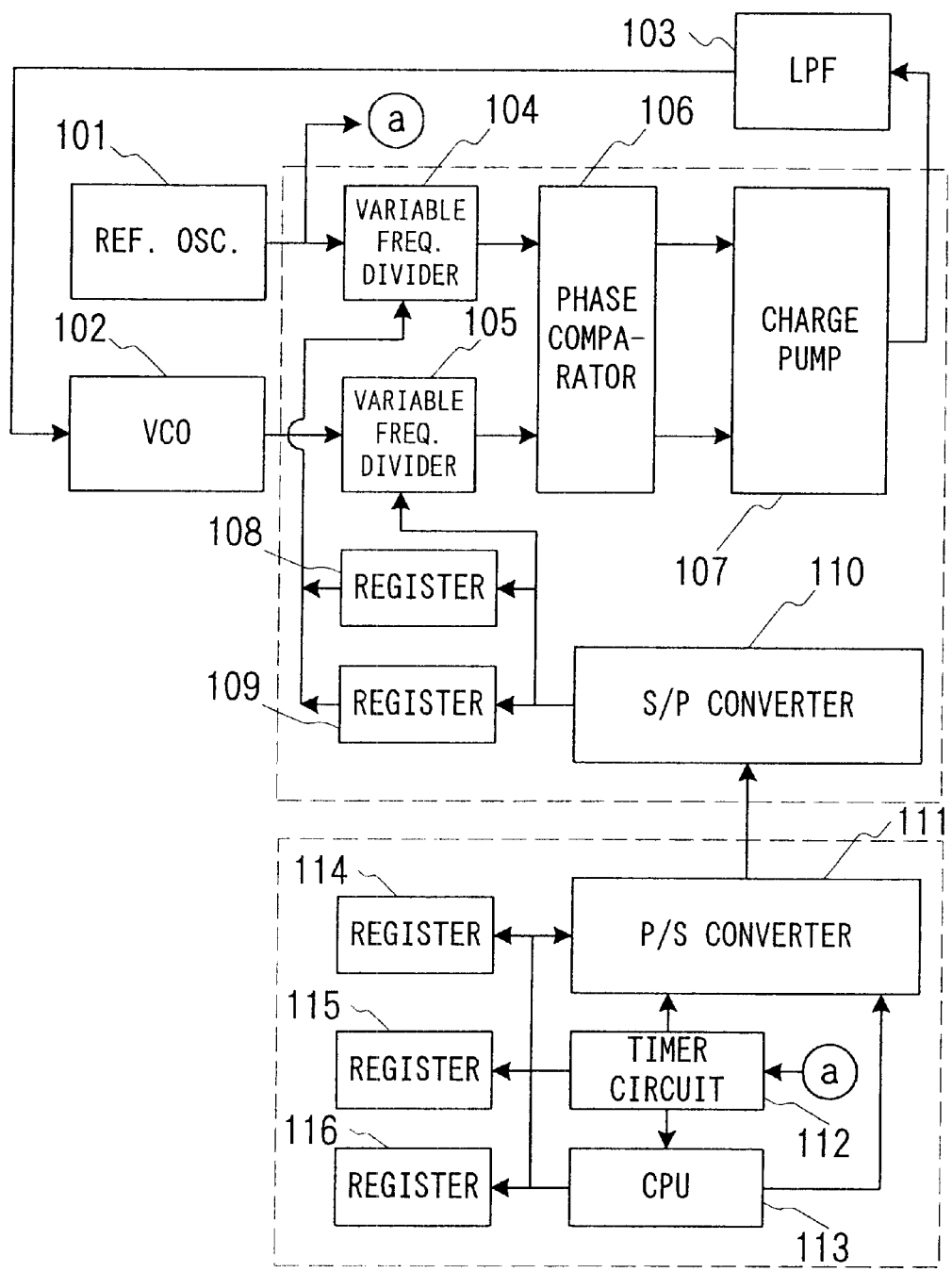
FIG. 1 is a block diagram showing a first embodiment of the PLL control circuit according to the present invention.

FIG. 1 is a block diagram showing a first embodiment of the PLL control circuit according to the present invention. Of the components of the circuit, those as in the prior art circuits described above are designated by like reference numerals.

This embodiment of the PLL control circuit is the same as the prior art circuits insofar as it comprises a reference frequency oscillator 101, a VCO 102, a variable frequency dividers 104 and 105, a phase comparator 106, a charge pump 107, a low-pass filter 103, a S/P converter 110, a P/S converter 111, a CPU 113 and a timer circuit 112. This PLL control circuit further comprises registers 108 and 109 connected between the S/P circuit 110 and the variable frequency divider 104 and registers 114, 115 and 116 connected to the P/S converter 111, the timer circuit 112 and the CPU 113, respectively.

The PLL circuit, shown in FIG. 1 thus features that it comprises the registers 108 and 109, which store the frequency division number of the variable frequency divider 104, and the registers 114, 115 and 116, which are necessary for frequency designation. The feature of the operation of the PLL control circuit shown in FIG. 1 will now be described mainly in connection with the registers 108, 109 and 114 to 116 as new components.

For switching the output frequency of the PLL circuit, the frequency division numbers of the variable frequency dividers 104 and 105 are rewritten at the same time. To this end, the registers 114 to 116 feed their output data sequentially to the P/S converter 111 at timings preset in the timer circuit 112. Upon completion of the data output, the timer circuit 112 produces an interruption to the CPU 113.

The construction and operation of the PLL circuit shown in FIG. 1 will now be described in detail. The construction will first be described. The reference frequency oscillator 101 is usually a crystal oscillator for oscillation at an exact frequency of, for instance, 14.4 MHz. The output of the reference frequency oscillator 101 is fed to the variable frequency oscillator 104, and is mainly used as a clock for the timer circuit 112. The variable frequency divider 104 divides the frequency of the reference frequency oscillator 101 with a designated (programmable) frequency division factor, and feeds the division frequency to the phase comparator 106. In this embodiment, when the frequency division factor is set to 72 and 90, the variable frequency divider 104 provides output frequencies of 200 kHz and 160 MHz, respectively.

The VCO 102 is an oscillator for providing an output frequency according to the output voltage of the low-pass filer 103. The VCO 102 feeds its output to the variable frequency divider 105. In this embodiment, the VCO 102 is oscillated at a frequency of 680 to 768 MHz. The variable frequency divider 105 divides the frequency of the VCO 102 by a designated frequency division factor, and feeds the division frequency to the phase comparator 106. In this embodiment, a frequency division factor is used, which ranges from 3,400 to 3,775 and from 4,625 to 4,800. The variable frequency divider 105 may be either an integer frequency divider or a fraction frequency divider. The phase comparator 106 checks whether the output signal phase of the variable frequency divider 105 is leading or lagging behind the output signal phase of the variable frequency divider 104, and feeds a lead/lagging-behind signal to the charge pump 107. The charge pump 107 charges or discharges the low-pass filter 103 according to the leding/lagging-behind signal from the phase comparator 106. The low-pass filter 103 feeds an output voltage to the VCO 102 in correspondence to the extent of its charging or discharging by the charge pump 107. The components described above constitute a PLL. As is well known in the art, it is possible to obtain stable frequencies as follows from the output of the VCO 102:

output frequency F of the VCO 102;

output frequency Fr of the reference frequency oscillator 101;

frequency division number R of the variable frequency divider 104;

frequency division number N of the variable frequency divider 105; and $F=(Fr/R) \times N$.

The PLL control circuit according to the present invention will now be described. The control part of the circuit is constituted by the registers 108 and 109, the S/P converter 110, the P/S converter 111, the timer circuit 112, the CPU 113 and the registers 114 and 116. The register 108 has its input side connected to the S/P converter 110 and its output side to the variable frequency divider 104. Likewise, the register 109 has its input side connected to the S/P converter 110 and its output side connected to the variable frequency divider 104. The S/P converter 110 has its input connected to the P/S converter 111 and its output connected to the registers 108 and 109 and the variable frequency divider 105. The S/P converter 110 receives serial data as its input, analyzes the data content thereof, converts the data to parallel data, and feeds the same to a proper destination. The P/S converter 111 has its input connected to the registers 114 to 116, the timer circuit 112 and the CPU 113, converts its input parallel data to serial data, and feeds out the same. The P/S converter 111 further feeds out serial data corresponding to the contents in the registers 114 to 116 at timings designated by the timer circuit 112. The P/S converter 111 further feeds out serial data upon reception of data from the CPU 113.

The register 114 stores data received from the CPU 113, and feeds its output to the P/S converter 111. Also, the register 115 stores data received from the CPU 113, and feeds its output to the P/S converter 111. Further, the register 116 stores data received from the CPU 113, and feeds its output to the P/S converter 111.

The timer circuit 112 receives the output of the reference frequency oscillator 101 as clock, and provides preset timings or predetermined time interval for the registers 114 to 116 to feed data stored therein serially via the P/S converter 111. The timer circuit 112 is also connected to the CPU 113, and upon completion of the data output from the register 116 it produces an interruption to the CPU 113. The CPU 113 is connected to the registers 114 to 116, the timer circuit 112 and the P/S converter 111, and it executes a control operation in a programmed procedure. The variable frequency dividers 104 and 105, the phase comparator 106, the charge pump 107, the registers 108 and 109 and the S/P converter 110 are formed on an LSI (large-scale semiconductor integrated circuit), and also the P/S converter 111, the timer circuit 112, th e CPU 113 and the registers 114 to 116 are formed on an LSI.

Figure 10:
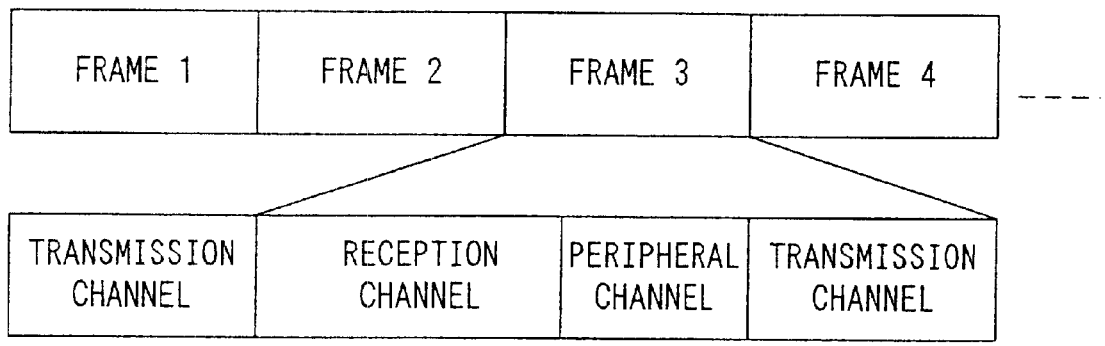
FIG. 10 shows the frame timing of a usual digital portable telephone set.

The operation of the PLL control circuit shown in FIG. 1 will now be described in detail. This PLL control circuit is used for, for instance, a local oscillator in a portable telephone set. As shown in FIG. 10, in a digital portable telephone set a reception channel, a peripheral channel and a transmission channel are switched one over to another in a predetermined cycle. At this time, the PLL output frequency should also be switched. In this frequency switching, it is important that the PLL output frequency is pulled in (or stabilized) in a short period of time. As an example, the PLL output frequency is assumed to be 680, 690 and 740 MHz at the reception channel time, the peripheral channel time and the transmission channel time, respectively.

Then, when the output frequency of the VCO 102 is set to 680 MHz at the reception channel time:
the phase comparison frequency of the phase comparator 106 is 200 kHz;
the frequency division number of the variable frequency divider 104 is 14.4 MHz/200 kHz=72; and
the frequency division number of the variable frequency divider 105 is 680 MHZ/200 kHz=3,400.

When the output frequency of the VCO 102 is set to 690 MHz at the peripheral channel time;
the phase comparison frequency of the phase comparator 106 is 20O kHz;
the frequency division number of the vairable frequency divider 104 is 14.4 MHz/200 kHz=72; and
the frequency division number of the variable frequency divider 105 is 690 MHz/200 kHz=3,450.

When the output frequency of the VCO 102 is set to 740 MHz at the transmission channel time;
the phase comparison frequency of the phase comparator 105 is 160 kHz;
the frequency division number for the variable frequency divider 104 is 14.4 MHz/160 kHz=90; and
the frequency division number of the variable frequency divider 105 is 74 MHz/160 kHz=4,652.

Figure 3:
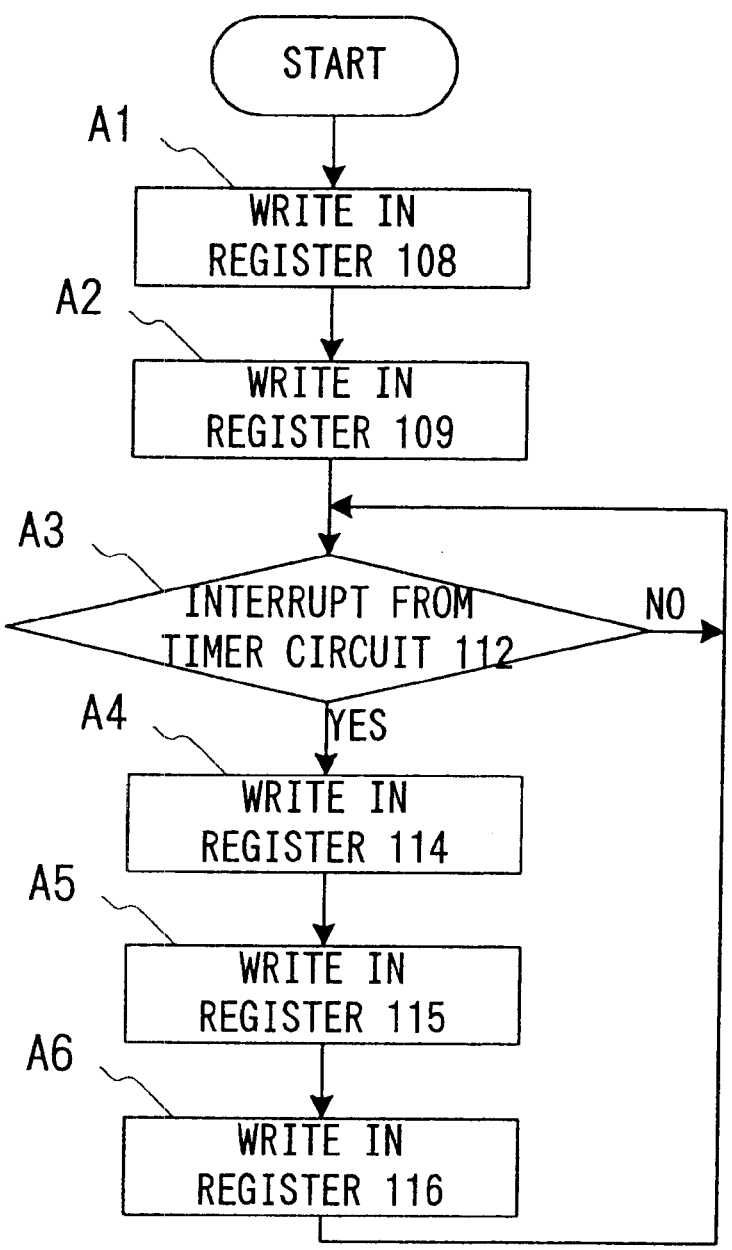
FIG. 3 is a flow chart of the CPU 113 in FIG. 1.

Now, the operation of sequentially designating the above setting data in the time schedule as shown in FIG. 10 will now be described with reference to the control flow chart of the CPU 113 shown in FIG. 3. FIG. 2 shows the data format of the serial data. In a step A1, the CPU 113 writes "72" as frequency division number data in the register 108. When developed in conformity to the format shown in FIG. 2, the written data is expressed as "000000000100100000". This data is delivered to the P/S converter 11. The P/S converter 111 feeds the received data as serial data to the S/P converter 110. Since "D01"–"D00"="00", the S/P converter 110 receiving the serial data writes "0000000001001000", i.e., numeral part of the frequency division number, in the register 108.

In a subsequent step A2, the CPU 113 writes "90" as frequency division number data in the register 109. When developed in conformity to the format shown in FIG. 2, the written data is expressed as "000000000101101010". This data is delivered to the P/S converter 111. The P/S converter 111 feeds the received data as serial data to the S/P converter 110. Since "D01"–"D00" is "10", the S/P converter 110 receiving the serial data writes "000000000101011010", i.e., numeral part of the frequency division number, in the register 109.

In a subsequent step A3, the CPU 113 waits an interruption from the timer circuit 112. When an interruption is provided (YES), the CPU 113 executes a step A4 of writing the data preset at the reception channel time in the register 114. When developed in conformity to the format shown in FIG. 2, this data is expressed as "000011010100100001".

In a subsequent step A5, the CPU 113 writes the data preset at the peripheral channel time in the register 115. When developed in conformity to the format shown in FIG. 2, this data is expressed as "000011010111101001". In a subsequent step A6, the CPU 113 writes the data reset in the transmission channel time in the register 116. When developed in conformity to the format shown in FIG. 2, this data is expressed as "000100100001000111".

Now, the operation of sequentially feeding out the data in the registers 114 to 116 at timings according to the time schedule provided by the timer circuit 122 will be described. Timer data have preliminarily been written in the timer circuit 112 such that they conform to the timings shown in FIG. 10. The timer circuit 112 reads out the data in the register 114, and feeds the read-out data as serial data via the P/S converter 111 to the S/P converter 110. Since "D01"–"D00"="01", the S/P converter 110 receiving the serial data sets "0000110101001000", i.e., numeral part of the frequency division number, in the variable frequency divider 105, while at the same time setting the data in the register 108 in the variable frequency divider 104. As these data:
the frequency division number of the variable frequency divider 104 is 72, and
the frequency division number of the variable frequency divider 105 is 3,400.

With the simultaneous setting of the frequency division numbers of the variable frequency dividers 104 and 105 as above, frequency skip which arises when separate setting timings are involved as in the prior art, can be avoided, and it is thus possible to switch the transmission channel time frequency (for instance 740 MHz) over to the reception channel time frequency (for instance 680 MHz) in a short period of time.

Then, after the lapse of a predetermined time the timer circuit 112 reads out the data in the register 115, and feeds the read-out data as serial data via the P/S converter 111 to the S/P converter 110. Since "D01"–"D00"="01", the S/P converter 110 receiving the serial data sets "0000110101111010", i.e., numeral part of the frequency division number, in the variable frequency divider 105, while at the same time setting the data in the register 108 in the variable frequency divider 104. As these data:

the frequency division number of the variable frequency divider 104 is 72; and the frequency division number of the variable frequency divider 105 is 3,400.

At the next timing, the timer circuit 112 reads out the data in the register 116, and feeds the read-out data as serial data via the P/S converter 111 to the S/P converter 110. Since "D01"–"D00"="11", the S/P converter 110 receiving the serial data sets "00001001000010001", i.e., numeral part of the frequency division number, in the variable frequency divider 105, while at the same time setting the data in the register 109 in the variable frequency divider 104. As these data:

the frequency division number of the variable frequency divider 104 is 90; and the frequency division number of the variable frequency divider 105 is 4,625.

With the simultaneous setting of the frequency division numbers of the variable frequency dividers 104 and 105, the frequency skip which arises when separate setting timings are involved as in the prior art, can be avoided, and it is thus possible to switch the peripheral channel time frequency (for instance 690 MHz) over to the transmission channel time frequency (for instance 740 MHz) in a short period of time. When the output of the data from the register 116 has been completed, the timer circuit 112 produces an interruption to the CPU 113.

Figure 4:
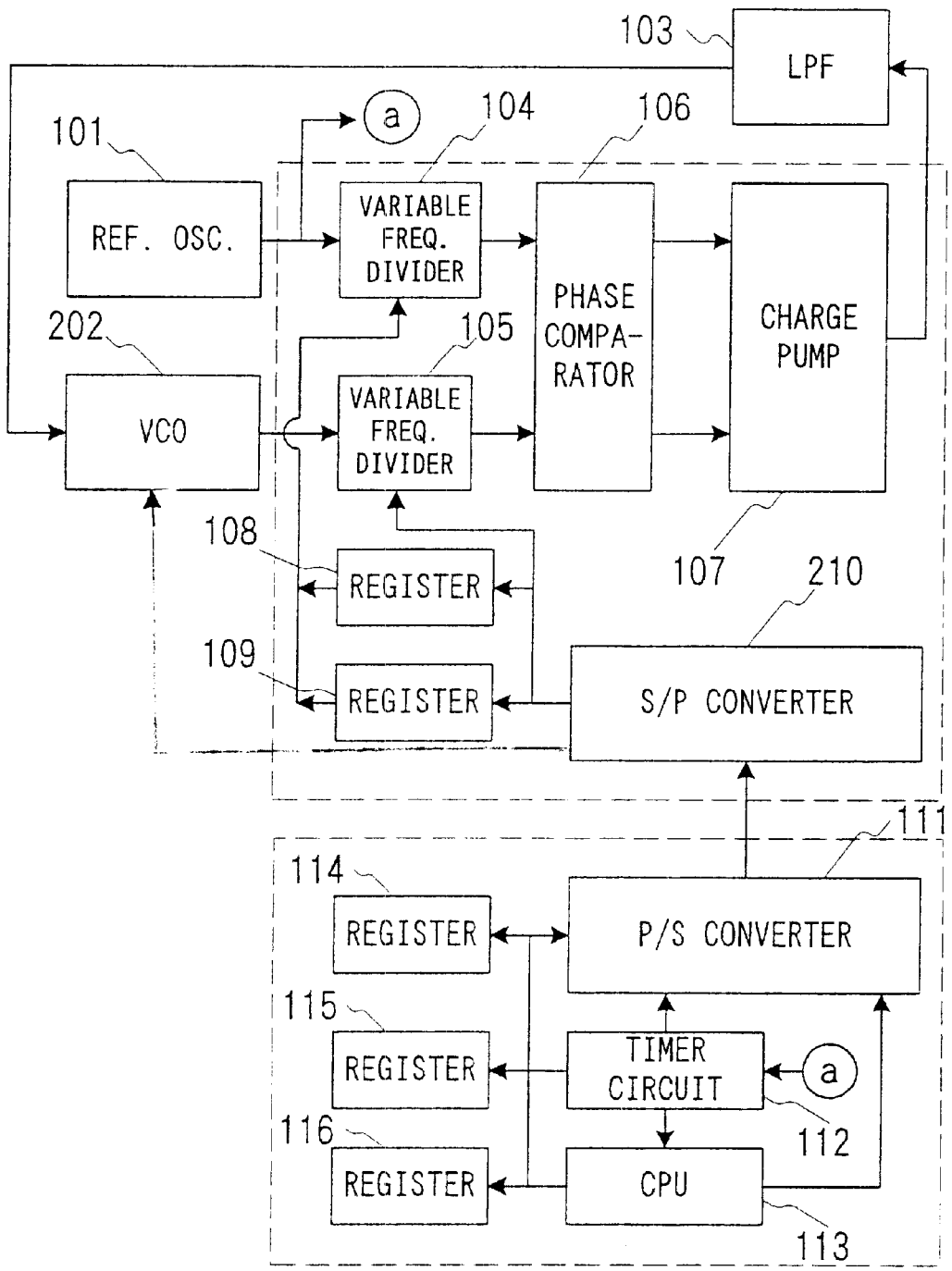
FIG. 4 is a block diagram showing a second embodiment of the PLL control circuit according to the present invention.
Figure 5:
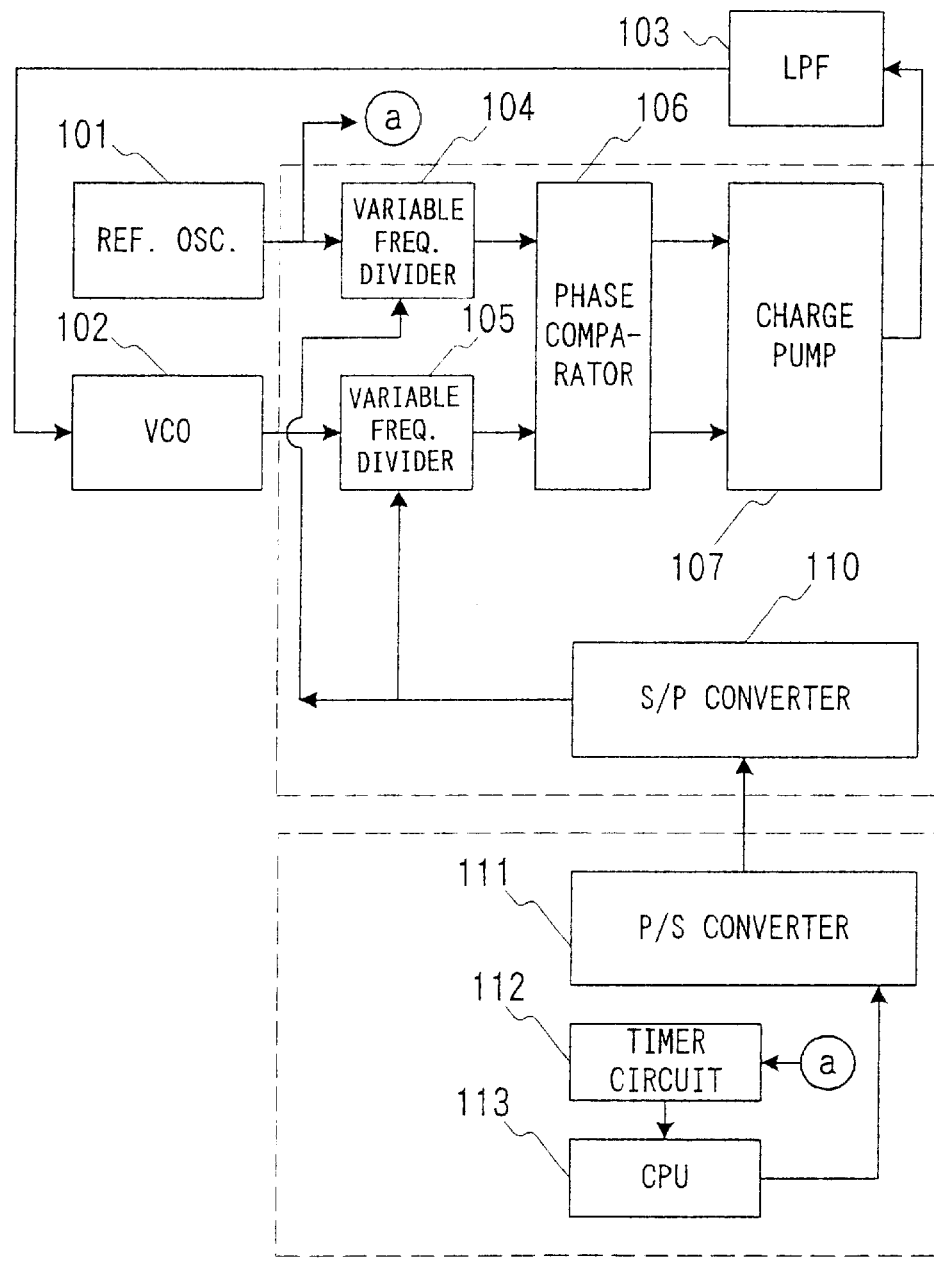
FIG. 5 is a block diagram showing an example of prior art PLL control circuit.

FIG. 4 is a block diagram showing a second embodiment of the PLL control circuit according to the present invention. For the sake of convenience, in the Figure the components like those in the PLL control circuit shown in FIG. 1 are designated by like reference numerals. The embodiment will now be described mainly in connection to its difference from the first embodiment shown in FIG. 1.

The PLL control circuit shown in FIG. 4 uses a VCO 202 with a frequency band switching terminal, and an S/P converter 210 feeds a frequency band switching signal to the VCO 202. For the remainder, the PLL and the control part of the PLL control circuit are the same as those shown in FIG. 1, and also like the case of FIG. 1 the circuit comprises registers 108, 109 and 114 to 116.

In case where the VCO 202 has a wide oscillation frequency band, it is possible to obtain a wide band of oscillation by switching the resonant frequency band of a resonator for it for every frequency band. When such VCO 202 is used, it is necessary to apply an "L" (or low) or "H" (or high) voltage to a band control terminal for every frequency band. Accordingly, the S/P converter 210 feeds a control signal for switching the oscillation frequency band of the VCO 202.

In the PLL control circuit shown in FIG. 4, the oscillation frequency of the VCO 202 is 680 to 755 MHz at the reception channel time and the peripheral channel time and 740 to 768 MHz at the transmission channel time. When "D00" is "1" in the serial data format shown in FIG. 2, the R bit is "0" at the reception/peripheral channel time and "1" at the transmission channel time. The S/P converter 210 receives the serial data, and when "D00"="1", it feeds an "L" output to the VCO 202 with R bit of "0". With R bit of "1", the S/P converter 210 feeds an "H" output to the VCO 202 at the same timing as the rewriting of the frequency division number of the variable frequency dividers 104 and 105.

As has been described in the foregoing, according to the present invention the frequency pull-in time at the time of the output frequency switching is reduced compared to the prior art system. This is so because the generation of a tentative frequency skip is prevented by simultaneously switching the frequency division numbers of the two variable frequency dividers. Also, by permitting the output frequency switching of the VCO in the PLL at the same time, the tentative frequency skip can be prevented at the output frequency switching in a broader frequency band as well.

Figure 7:
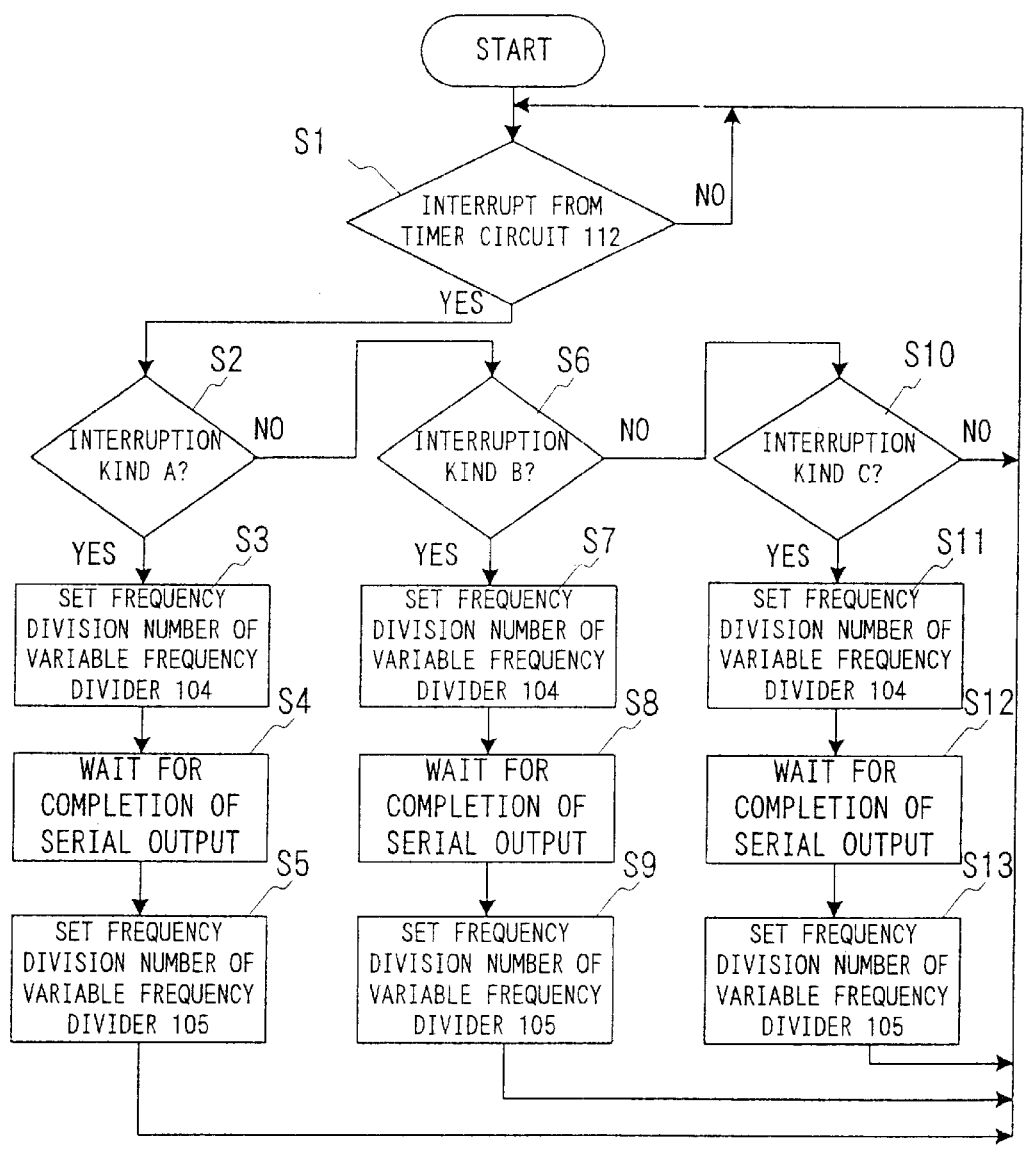
FIG. 7 is a flow chart of CPU control of PLL control circuit in FIG. 5.
Figure 8:
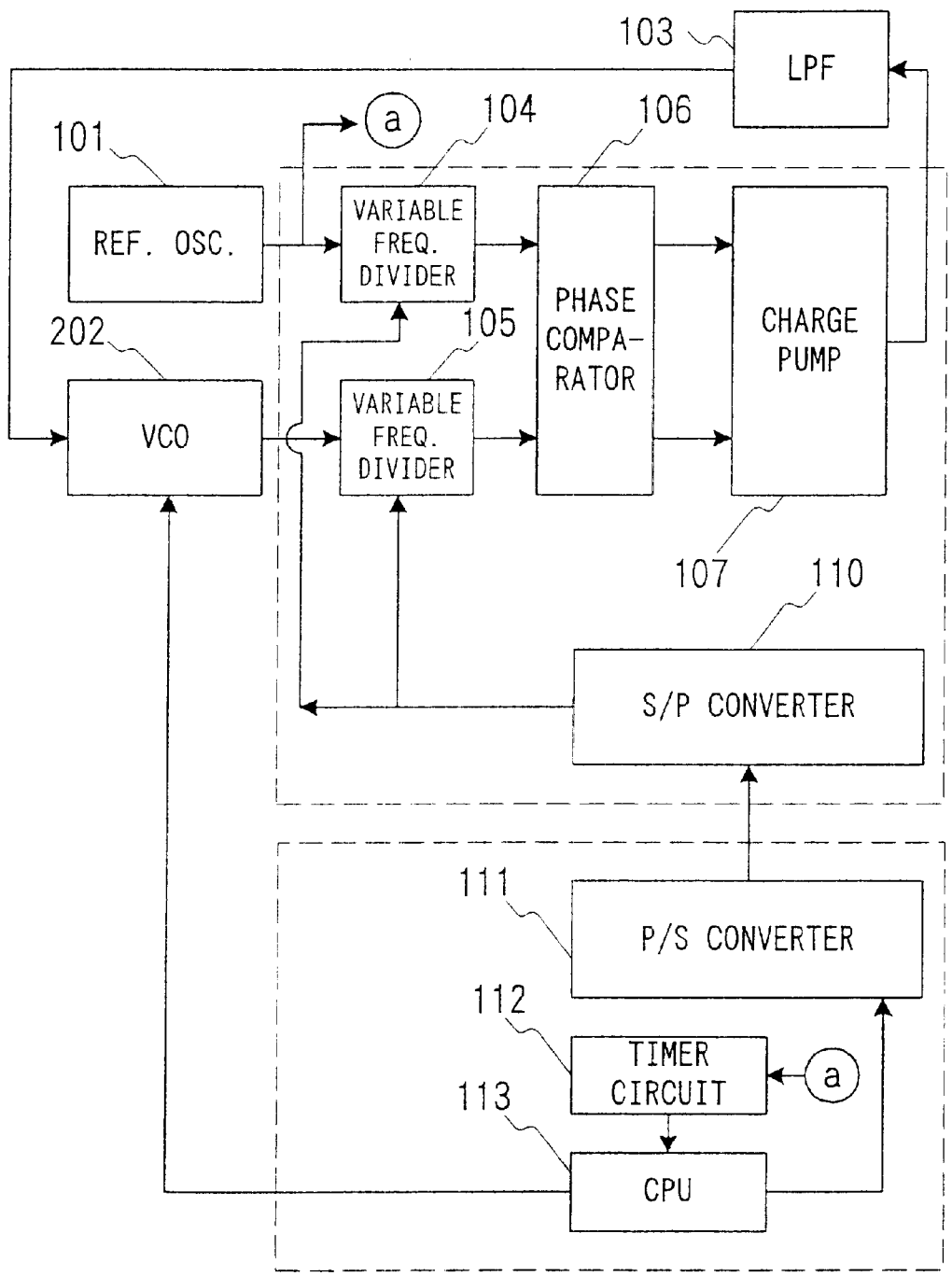
FIG. 8 is a block diagram showing another prior art PLL control circuit.
Figure 9:
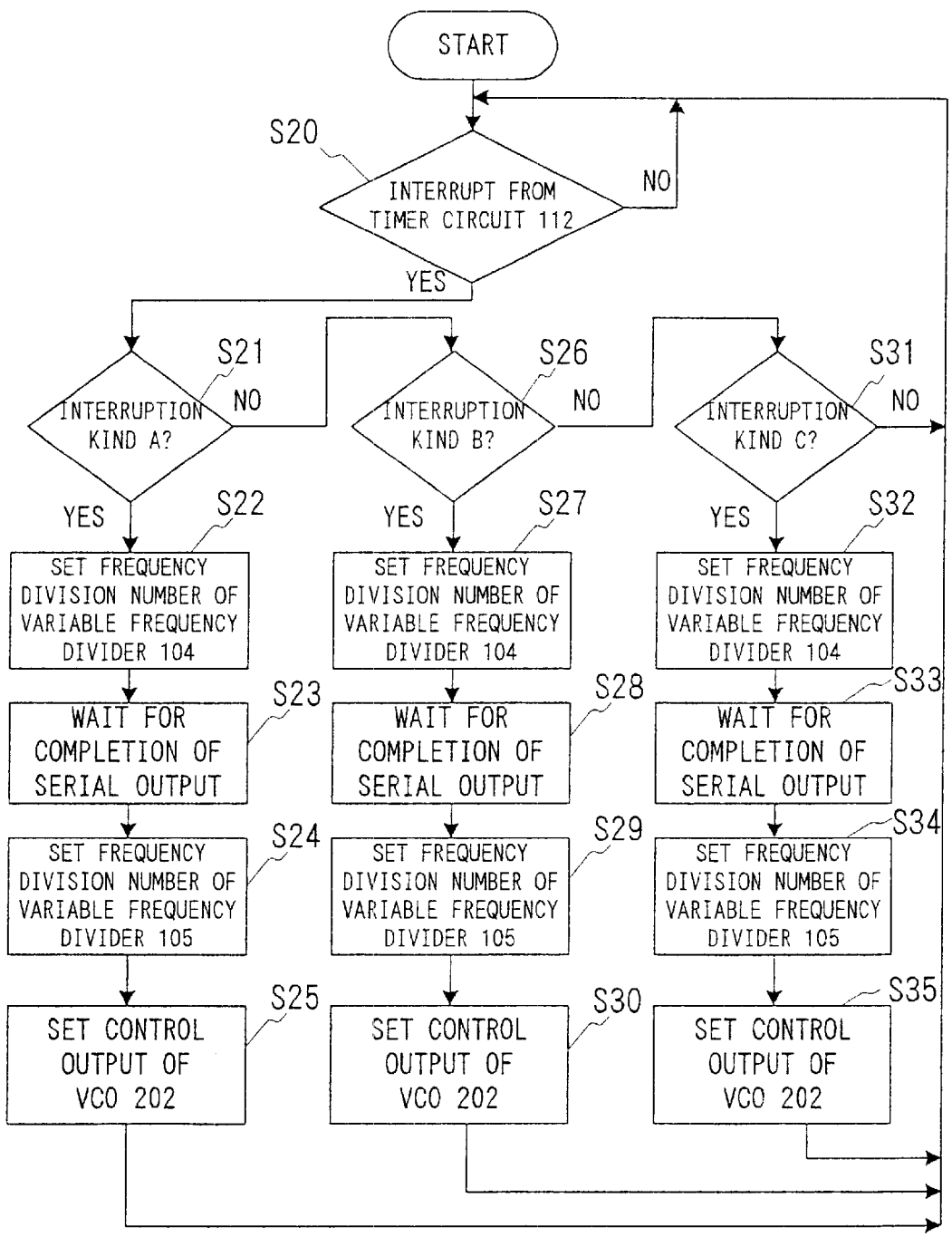
FIG. 9 is a flow chart illustrating the operation of the prior art PLL control circuit in FIG. 8.

Furthermore, according to the present invention the control of the CPU is simple, and it is possible to alleviate the burden on the CPU and reduce the current consumption. This is so because the CPU operation is simplified by the provision of the registers as is obvious from the comparison of FIG. 3 and FIG. 7 or 9.

Changes in construction will occur to those skilled in the art and various apparently different modifications and embodiments may be made without departing from the scope of the present invention. The matter set forth in the foregoing description and accompanying drawings is offered by way of illustration only. It is therefore intended that the foregoing description be regarded as illustrative rather than limiting.

What is claimed is:

1. A PLL control circuit comprising:

a reference frequency oscillator for executing oscillation at a reference oscillation frequency;

a voltage controlled oscillator (VCO) for feeding out an output at a frequency corresponding to a control voltage;

first and second variable frequency dividers for frequency dividing the outputs of the reference frequency oscillator and the VCO, respectively;

a phase comparator for phase comparing the outputs of the two variable frequency dividers;

a low-pass filter for filtering out the output of the phase comparator and feeding the control voltage to the VCO;

a serial-to-parallel converter for controlling the variable frequency dividers;

a first plurality of registers for storing different frequency division numbers of the first variable frequency divider received from the serial-to-parallel converter; and a second plurality of registers for storing frequency division numbers to be provided to the second variable frequency divider through the serial-to-parallel converter.

2. A PLL control circuit comprising:

a reference frequency oscillator for executing oscillation at a reference oscillation frequency;

a voltage controlled oscillator (VCO) for feeding out an output at a frequency corresponding to a control voltage;

first and second variable frequency dividers for frequency dividing the outputs of the reference frequency oscillator and the VCO, respectively;

a phase comparator for phase comparing the outputs of the two variable frequency dividers;

a low-pass filter for filtering out the output of the phase comparator and feeding the control voltage to the VCO;

a serial-to-parallel converter for controlling the variable frequency dividers;

a first plurality of registers for storing frequency division numbers of the first variable frequency divider received from the serial-to-parallel converter; and a second plurality of registers for storing frequency division numbers to be provided to the second variable frequency divider through said serial-to-parallel converter, wherein the frequency division numbers of the variable frequency dividers are set simultaneously.

3. A PLL control circuit comprising:
a reference frequency oscillator for executing oscillation at a reference oscillation frequency;
a voltage controlled oscillator (VCO) for feeding out an output at a frequency corresponding to a control voltage;
first and second variable frequency dividers for frequency dividing the outputs of the reference frequency oscillator and the VCO, respectively;
a phase comparator for phase comparing the outputs of the two variable frequency dividers;
a low-pass filter for filtering out the output of the phase comparator and feeding the control voltage to the VCO;
a serial-to-parallel converter for controlling the variable frequency dividers;
a first plurality of registers for storing frequency division numbers of the first variable frequency divider received from the serial-to-parallel converter;
a second plurality of registers for storing frequency division numbers to be provided to the second variable frequency divider through the serial-to-parallel converter; and
a timer circuit for determining the timing of switching of the frequency division numbers of the variable frequency dividers.

4. A PLL control circuit comprising:
a reference frequency oscillator for executing oscillation at a reference oscillation frequency;
a voltage controlled oscillator (VCO) for feeding out an output at a frequency corresponding to a control voltage;
first and second variable frequency dividers for frequency dividing the outputs of the reference frequency oscillator and the VCO, respectively;
a phase comparator for phase comparing the outputs of the two variable frequency dividers;
a low-pass filter for filtering out the output of the phase comparator and feeding the control voltage to the VCO;
a serial-to-parallel converter for controlling the variable frequency dividers;
a first plurality of registers for storing frequency division numbers of the variable frequency dividers;
a second plurality of registers for storing frequency division numbers to be provided to the second variable frequency divider through said serial-to-parallel converter; and
a timer circuit for determining the timing of switching of the frequency division numbers of the variable frequency dividers,
wherein the frequency division numbers of the variable frequency dividers are set simultaneously.

5. A PLL control circuit comprising:
a reference frequency oscillator for executing oscillation at a reference oscillation frequency;
a voltage controlled oscillator (VCO) for feeding out an output at a frequency corresponding to a control voltage;
first and second variable frequency dividers for frequency dividing the outputs of the reference frequency oscillator and the VCO, respectively;
a phase comparator for phase comparing the outputs of the two variable frequency dividers;
a low-pass filter for filtering out the output of the phase comparator and feeding the control voltage to the VCO;
a serial-to-parallel converter for controlling the variable frequency dividers;
a first plurality of registers for storing frequency division numbers of the first variable frequency divider received from the serial-to-parallel converter;
a second plurality of registers for storing frequency division numbers to be provided to the second variable frequency divider through the serial-to-parallel converter;
a timer circuit for determining the timing of switching of the frequency division numbers of the variable frequency dividers; and
a CPU controlled by the timer circuit, the timer circuit being capable of producing an interruption to the CPU after reading contents stored in one of the second plurality of registers.

6. A PLL control circuit comprising:
a reference frequency oscillator for executing oscillation at a reference oscillation frequency;
a voltage controlled oscillator (VCO) for feeding out an output at a frequency corresponding to a control voltage;
first and second variable frequency dividers for frequency dividing the outputs of the reference frequency oscillator and the VCO, respectively;
a phase comparator for phase comparing the outputs of the two variable frequency dividers;
a low-pass filter for filtering out the output of the phase comparator and feeding the control voltage to the VCO;
a serial-to-parallel converter for controlling the variable frequency dividers;
at least one first register for simultaneously setting frequency division numbers of the first variable frequency divider;
a plurality of second registers for storing frequency division numbers to be provided to the second variable frequency divider through the serial-to-parallel converter; and
a timer circuit for determining the timing of switching of the frequency division numbers of the variable frequency dividers,
wherein the timer circuit operates according to the output of the reference frequency oscillator of the PLL.

7. A PLL control circuit comprising:
a reference frequency oscillator for executing oscillation at a reference oscillation frequency;
a voltage controlled oscillator (VCO) for feeding out an output at a frequency corresponding to a control voltage;
first and second variable frequency dividers for frequency dividing the outputs of the reference frequency oscillator and the VCO, respectively;
a phase comparator for phase comparing the outputs of the two variable frequency dividers;
a low-pass filter for filtering out the output of the phase comparator and feeding the control voltage to the VCO;
a serial-to-parallel converter for controlling the variable frequency dividers;
a first plurality of registers for storing serial data received from the serial-to-parallel converter;
a second plurality of registers for storing frequency division numbers to be provided to the second variable frequency divider through the serial-to-parallel converter;

a timer circuit for determining the timing of setting of the frequency division numbers of the variable frequency dividers; and a CPU controlled by the timer circuit, the timer circuit being capable of producing an interruption to the CPU after reading contents stored in the second plurality of registers, wherein the frequency division numbers of the variable frequency dividers are simultaneously switched to different values.

8. The PLL control circuit claimed in claim 1, wherein said serial-to-parallel converter provides a frequency band switching signal to the VCO.

9. The PLL control circuit claimed in claim 2, wherein said serial-to-parallel converter provides a frequency band switching signal to the VCO.

10. The PLL control circuit claimed in claim 3, wherein said serial-to-parallel converter provides a frequency band switching signal to the VCO.

11. The PLL control circuit claimed in claim 4, wherein said serial-to-parallel converter provides a frequency band switching signal to the VCO.

12. The PLL control circuit claimed in claim 5, wherein said serial-to-parallel converter provides a frequency band switching signal to the VCO.

13. The PLL control circuit claimed in claim 6, wherein said serial-to-parallel converter provides a frequency band switching signal to the VCO.

14. The PLL control circuit claimed in claim 7, wherein said serial-to-parallel converter provides a frequency band switching signal to the VCO.

* * * * *